(12) United States Patent
Ellis-Monaghan et al.

(10) Patent No.: US 8,334,195 B2
(45) Date of Patent: Dec. 18, 2012

(54) PIXEL SENSORS OF MULTIPLE PIXEL SIZE AND METHODS OF IMPLANT DOSE CONTROL

(75) Inventors: John J. Ellis-Monaghan, Grand Isle, VT (US); Jeffrey P. Gambino, Westford, VT (US); Daniel N. Maynard, Craftsbury, VT (US); Richard J. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 472 days.

(21) Appl. No.: 12/556,139

(22) Filed: Sep. 9, 2009

(65) Prior Publication Data

US 2011/0057282 A1    Mar. 10, 2011

(51) Int. Cl.
*H01L 21/22* (2006.01)
(52) U.S. Cl. .................. 438/549; 438/144; 257/440
(58) Field of Classification Search .......... 438/144–148; 257/225–234, 431, 440, 443–448, 461–465
See application file for complete search history.

(56) References Cited

U.S. PATENT DOCUMENTS

| | | | |
|---|---|---|---|
| 6,022,768 A | 2/2000 | Peidous | |
| 6,359,323 B1 * | 3/2002 | Eom et al. | 257/440 |
| 6,582,995 B2 | 6/2003 | Hsieh et al. | |
| 7,102,184 B2 | 9/2006 | Rhodes | |
| 7,214,627 B2 | 5/2007 | Merrett et al. | |
| 7,303,952 B2 | 12/2007 | Adkisson et al. | |
| 7,636,115 B2 * | 12/2009 | Hong et al. | 348/294 |
| 8,072,007 B2 * | 12/2011 | Koshiba | 257/228 |
| 2006/0158582 A1 * | 7/2006 | Hwang | 349/80 |
| 2007/0020822 A1 * | 1/2007 | Chou et al. | 438/149 |
| 2007/0231710 A1 | 10/2007 | Aton et al. | |
| 2009/0072337 A1 * | 3/2009 | Lee | 257/440 |

OTHER PUBLICATIONS

C.T. Black et al., "Polymer Self Assembly in Semiconductor Microelectronic", IBM j. Res & Dev. vol. 51 No. 5 Sep. 2007, pp. 605-633.

* cited by examiner

*Primary Examiner* — Jenny L Wagner
*Assistant Examiner* — Mark Tornow
(74) *Attorney, Agent, or Firm* — Anthony Canale; Roberts Mlotkowski Safran & Cole, P.C.

(57) ABSTRACT

CMOS pixel sensors with multiple pixel sizes and methods of manufacturing the CMOS pixel sensors with implant dose control are provided. The method includes forming a plurality of pixel sensors in a same substrate and forming a masking pattern over at least one of the plurality of pixel sensors that has a pixel size larger than a non-masked pixel sensor of the plurality of pixel sensors. The method further includes providing a single dosage implant to the plurality of pixel sensors. The at least one of the plurality of pixel sensors with the masking pattern receives a lower dosage than the non-masked pixel sensor.

19 Claims, 4 Drawing Sheets

PIXEL SENSORS OF MULTIPLE PIXEL SIZE AND METHODS OF IMPLANT DOSE CONTROL

FIELD OF THE INVENTION

The invention relates to pixel sensors and methods of implant control for the pixel sensors and, more particularly, to CMOS pixel sensors with multiple pixel sizes and methods of manufacturing the pixel sensors using implant dose control.

BACKGROUND

A photodiode is a type of photodetector which is capable of converting light into either current or voltage, depending upon the mode of operation. P-N photodiodes are used in applications ranging from photoconductors and charge-coupled devices to use in consumer electronics such as compact disc players, smoke detectors, and the receivers for remote controls.

The material used to make a photodiode is important to defining its properties. This is due mainly to the fact that only photons with sufficient energy to excite electrons across the material's bandgap will produce significant photocurrents. Materials commonly used to produce photodiodes include, for example, silicon, germanium, and indium gallium arsenide.

Photodiodes are manufactured by implanting a dopant (typically n-type) into a substrate to create a p-n junction that senses light. In the manufacturing process, the photodiode implant must be adjusted for each pixel size (i.e., higher dose for smaller pixel sizes), which complicates manufacturing logistics and makes it impossible to run multiple pixel sizes on a single wafer using current technologies. For example, in the manufacturing process, photodiodes of a same pixel size must be manufactured on a single wafer in order to ensure that the correct dosage is implanted into the photodiode. For this reason, photodiodes of different sizes are currently formed on different wafers, since each size photodiode requires a different implant recipe and route for each pixel size.

A significant cost factor in the manufacture of the photodiodes is the design verification phase. This is mainly due to the costs for manufacturing of the mask. For example, as each pixel size has to be formed on a separate wafer, multiple masks have to be manufactured for each wafer. This makes for a very expensive and time consuming process for verifying designs of different pixel sizes, as well as the manufacture of such photodiodes with different pixel sizes.

Accordingly, there exists a need in the art to overcome the deficiencies and limitations described hereinabove.

SUMMARY

In a first aspect of the invention, a method includes forming a plurality of pixel sensors in a same substrate and forming a masking pattern (e.g., of resist, co-polymer or combination thereof) over at least one of the plurality of pixel sensors that has a pixel size larger than a non-masked pixel sensor of the plurality of pixel sensors. The method further includes providing a single dosage implant to the plurality of pixel sensors. The at least one of the plurality of pixel sensors with the masking pattern receives a lower dosage than the non-masked pixel sensor.

In another aspect of the invention, a structure includes a single substrate having a first photodiode with a first pixel size and a second photodiode with a second pixel size that is different than the first pixel size. The structure further includes a blocking pattern on the second photodiode to control an implant dosage into the second photodiode.

In yet another aspect of the invention, a design structure is embodied in a machine readable medium for designing, manufacturing, or testing an integrated circuit. The design structure comprises: a plurality of pixel sensors in a same substrate; a masking pattern over at least one of the plurality of pixel sensors that has a pixel size larger than a non-masked pixel sensor of the plurality of pixel sensors; and a single dosage implant to the plurality of pixel sensors, wherein the at least one of the plurality of pixel sensors with the masking pattern receives a lower dosage than the non-masked pixel sensor.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to pixel sensors and methods of implant control for the pixel sensors and, more particularly, to CMOS pixel or image sensors with multiple pixel sizes and methods of manufacturing the pixel sensors using implant dose control. More specifically, the present invention provides photodiodes (e.g., CMOS pixel or image sensors) with different pixel sizes formed on the same chip (wafer) and, advantageously, methods that allow the photodiodes to be fabricated simultaneously with one photodiode implant dose.

In embodiments, the invention implements a "filtered" blockout mask (e.g., resist) to adjust the implant dose in order to fabricate the photodiodes with different pixel sizes formed on the same chip. For example, the present invention varies resist coverage between regions which require full implant dose (e.g., for the smallest pixel size) and a lower implant dose (e.g., for large pixel size). Illustratively, the methods of the present invention strip all resist coverage over the photodiodes with the smallest pixel size; whereas, the methods of the present invention leave a thin resist layer or varying coverage over the photodiodes with larger pixel sizes. The invention also contemplates the use of filtered blockout masks of di-block copolymer. Advantageously, in this way, the present invention can use a single implant dose to fabricate a plurality of photodiodes having different pixel sizes on a single chip. In further embodiments, the present can also be used to make devices with multiple threshold voltages, without using an extra Vt adjust mask.

Figure 1:
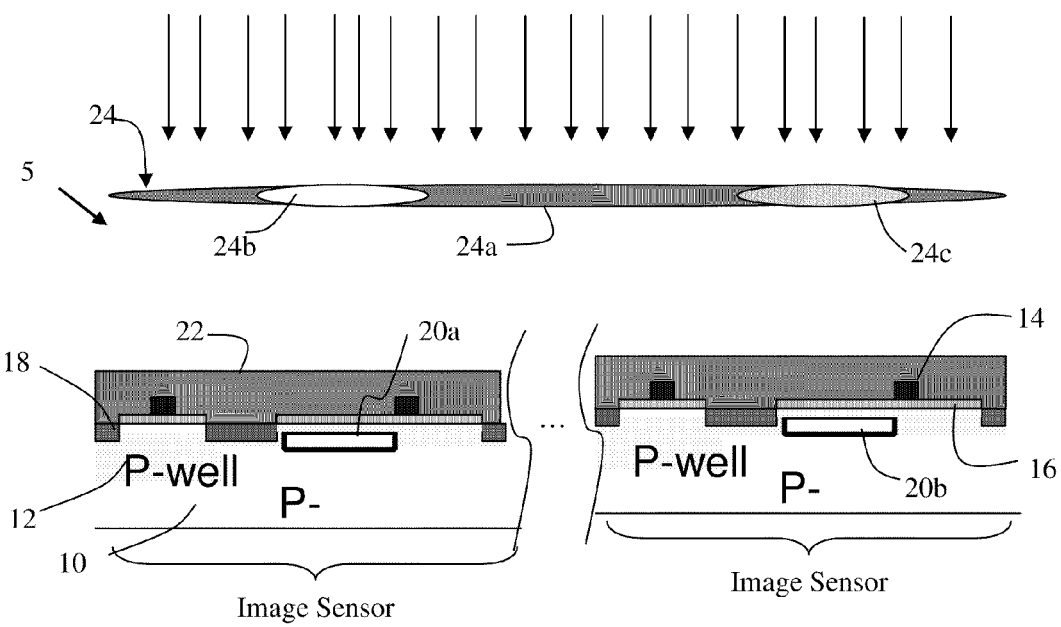
FIGS. 1 and 2 show CMOS pixel sensors (photodiodes) and respective processing steps in accordance with aspects of the invention.

FIG. 1 shows a structure and method of fabricating photodiodes having different pixel sizes on a single chip in accordance with a first aspect of the invention. Specifically, the structure 5 includes a plurality of image arrays of different pixel sizes on a single chip. Although only two image arrays are shown, it should be understood that FIG. 1 (and the remaining figures) can equally represent three or more image arrays on a single chip or wafer as denoted by the representation "...". The structure 5 also includes thin oxide logic and thick oxide logic between, for example, each of the image arrays of different pixel sizes, also denoted by the representation of In embodiments, the thin oxide logic and thick oxide logic will be protected with a resist during the implant dose of the plurality of image arrays.

The image arrays each comprise, for example, a P-well 12 formed in a substrate 10 using a conventional implantation process such that further explanation is not required herein for an understanding of the invention. The structure 5 further includes a gate 14 formed on a gate oxide 16 such as, for example, a layer of $SiO_2$. The gate 14 and gate oxide 16 can be formed using any conventional deposition and patterning processes, e.g., lithographic and etching (reactive ion etching) processes, known to those of skill in the art. Shallow trench isolation structures 18 are provided on opposing sides of the gate 14. The shallow trench isolation structures 18 can be formed using conventional processes such as, for example, conventional lithographic, etching and deposition processes. The shallow trench isolation structures 18 can be filled with a dielectric such as, for example, oxide.

A first photodiode (CMOS pixel sensor) 20a and a second photodiode (CMOS pixel sensor) 20b are formed in the substrate 10. In embodiments, the first photodiode 20a has a small pixel size, e.g., 2 micron, and the second photodiode 20b has a larger pixel size, e.g., 4 microns. It should be understood by those of skill in the art that the dimensions provided herein are merely illustrative examples and that the present invention should not be limited to such pixel sizes. As such, those of skill in the art should understand that the present invention is not limited to any pixel size, with the understanding that multiple pixel sizes are contemplated by the present invention.

Still referring to FIG. 1, a resist 22 is formed over the entire structure, including the first photodiode 20a and the second photodiode 20b. In embodiments, the resist 22 can be deposited on the structure using, for example, a conventional deposition process (i.e., such as a spin-on dispense of liquid precursor, followed by baking to remove solvent). The resist 22 can be any conventional resist such as, for example, any photo-sensitive material that transfers a pattern from the mask onto the wafer.

FIG. 1 further shows a halftone mask 24 aligned over the structure 5. The halftone mask 24 includes a light-blocking layer 24a, transparent substrate 24b and one or more semi-transparent layers 24c. In embodiments, the transparent substrate 24b can be, for example, a quartz substrate that allows transmission of a certain light wavelength to pass through the transparent portion of the mask. The semi-transparent layer 24c can be made from, for example, a thin layer of metal, e.g., less than 1000 Å of chromium (Cr) molybdenum silicide ($MoSi_x$), that allows transmission of only a portion of the light to pass through the semi-transparent portion of the mask; whereas, the light-blocking layer 24a can be made from a thick layer of metal that will not allow any or minimal transmission of light.

As further shown in FIG. 1, the transparent substrate 24b is aligned with the first photodiode 20a and the one or more semi-transparent layers 24c are aligned with the second photodiode 20b. On the other hand, the light-blocking layer 24a is aligned with the remaining portions of the structure 5 including, for example, the thin and thick oxide logic, as well as the gate structures near each of the photodiodes. As further shown, light (represented by arrows) is transmitted from a source towards the halftone mask 24.

Figure 2:
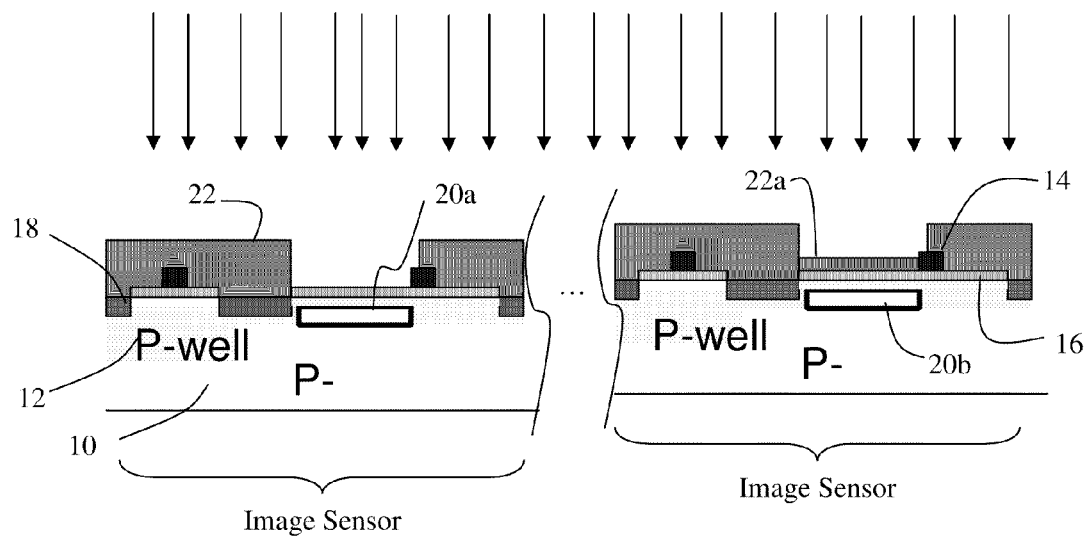

Referring to FIG. 2, in an illustrative example, light will pass through the transparent substrate 24 in order to completely expose the resist 22 over the first photodiode 20a. The exposure of the resist 22, in turn, will result in complete dissolution of the resist 22 (i.e., in subsequent develop steps) over the first photodiode 20a to form an opening over the first photodiode 20a. On the other hand, the semi-transparent layer 24c will partially block the light over the second photodiode 20b to partially expose the resist over the second photodiode 20b. The partial exposure of the resist 22 results in a thin resist layer 22a. (i.e., after subsequent develop steps. Image formation in photoresist comprises expose+develop). Also, light will be completely or substantially completely blocked by the light-blocking layer 24a resulting in a thick resist layer over the remaining portions of the structure. Thus, by using the halftone mask 24, a resist pattern with film thickness difference is developed on the structure, e.g., no resist, thin resist and thick resist patterns.

FIG. 2 further shows a single dose implant, e.g., phosphorous, (represented by arrows) striking the structure 5 of the present invention. The single dose implant will provide a larger dose to the first photodiode 20a than the second photodiode 20b due to the resist thickness. For example, the first photodiode 20a will be exposed to a full dosage through the opening (e.g., no blocking resist) over the first photodiode 20a. In contrast, the second photodiode 20b will be exposed only to a partial dosage due to the thin layer of resist 22a remaining over the second photodiode 20b. That is, the thin layer of resist 22a over the second photodiode 20b will partially block the single dose implant from striking the second photodiode 20b thus effectively reducing the dosage striking the second photodiode 20b.

The resist thickness of each portion of the structure 5 is selected based on the projected implant dose. More specifically, the resist thickness is selected based on the pixel size of the second photodiode 20b, as well as the initial dosage needed for the first photodiode 20a. For example, for a projected range of implanted species of 1000 Å, the dose will be reduced by approximately half, by using a thin resist layer, 1000 Å in thickness, over the photodiode, (i.e., if phosphorous dose for small pixel equals 4E12 $cm^{-2}$, then the phosphorous dose for the large pixel, coated with 500 Å of photoresist, will be approximately 2E12 $cm^{-2}$.

Figure 3:
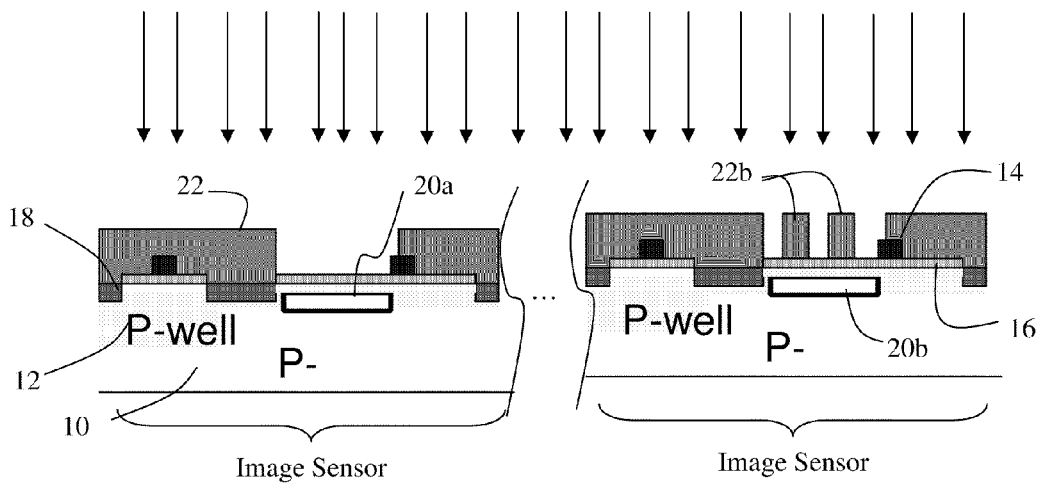
FIG. 3 shows photodiodes with multiple pixel sizes and respective processing steps in accordance with another aspect of the invention.

FIG. 3 shows another embodiment of the present invention. In the embodiment of FIG. 3, the resist 22 has been patterned over the second photodiode 20b. More specifically, using a mask with a pattern that matches the resist pattern of FIG. 3, light will pass through the transparent portion to completely expose the resist 22 over the first photodiode 20a. As discussed above, the exposure of the resist 22 will completely dissolve the resist 22 over the first photodiode 20a to form an opening. On the other hand, the resist 22 over the second photodiode 20b is patterned into, for example, cylinders, pegs, stripes, donuts or other geometries 22b which will partially block the dosage striking the second photodiode 20b to effectively reduce the dosage striking the second photodiode 20b. Thus, in this embodiment, the resist pattern will have a different pattern over the second photodiode 20b than the first photodiode 20a in order to control the dosage striking the respective photodiodes, i.e., the geometries 22b will partially block the dosage striking the second photodiode 20b.

In embodiments, the geometries 22*b* are sized to allow the dopant to diffuse laterally in the second photodiode 20*b*. For example, the dimensions of the geometries 22*b* should be no more than twice the diffusion distance of the dopant. As an example, the dimensions of the geometries 22*b* can be about 1000 Å for phosphorous (e.g., with diffusion distance of about 500 Å). This ensures that the second photodiode 20*b* is thoroughly doped. In this way, the geometries 22*b* will control the dosage striking the second photodiode 20*b*.

In embodiments with three or more image arrays, it is contemplated to leave some of the resist 22, e.g., cylinders or pegs 22*b*, in the opening of the first photodiode 20*a* to reduce the dosage striking the first photodiode 20*a*. In this embodiment, the patterning over the first photodiode 20*a* and the second photodiode 20*b* will be different based on the desired dosage level required for each photodiode. Also, in this embodiment, the photodiode requiring the full dosage will be completely exposed through an opening, with no blocking resist.

Figure 4:
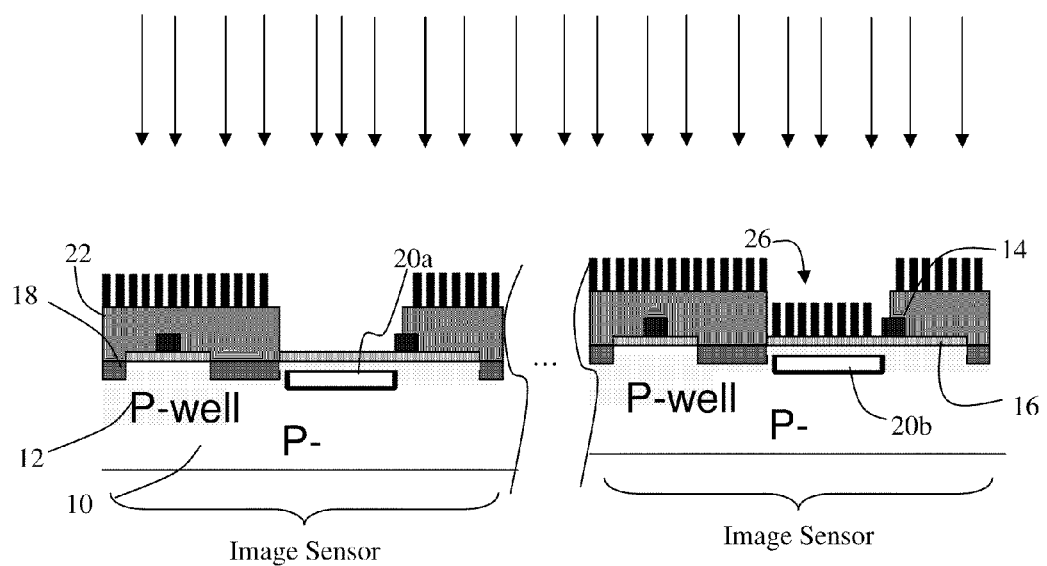
FIG. 4 shows photodiodes with multiple pixel sizes and respective processing steps in accordance with another aspect of the invention.

FIG. 4 shows another embodiment of the present invention. In the embodiment of FIG. 4, blocks of di-block copolymer thin film 26 are formed in the opening over the second photodiode 20*b*, and are configured to provide a smaller diffusion distance than the resist pattern of FIG. 3. The blocks of di-block copolymer thin film 26 also eliminate the need for light exposure to create pegs, cylinders stripes, donuts or other geometries for dosage control. Additionally, in the embodiment shown in FIG. 4, the blocks of di-block copolymer thin film 26 control the dosage striking the second photodiode 20*b*, thereby effectively reducing the dosage striking the second photodiode 20*b*.

In the embodiment of FIG. 4, the resist 22 has been patterned to expose the first photodiode 20*a* and the second photodiode 20*b*. More specifically, using a mask with a pattern that matches the resist pattern of FIG. 4, light will pass through the transparent portion in order to completely expose the resist 22 over the first photodiode 20*a* and the second photodiode 20*b*. This, in turn, will dissolve the resist 22 over the first photodiode 20*a* and the second photodiode 20*b*. A di-block copolymer thin film is deposited on the structure 5, including in the openings over the first photodiode 20*a* and the second photodiode 20*b*. (See C. T. Black et al., IBM J. Res. Dev., Sept. 2007, pp. 605-633.) The di-block copolymer thin film is a two phase material, for example, polystyrene (PS) and polymethylmethacrylate (PMMA). A solution containing the two materials is spin-cast onto the wafer, then baked to remove solvents and to separate the phases. The phase separation can result in self-assembled patterns, such as vertically oriented PMMA rods (weak phase) in a PS matrix (strong phase). The weak phase is then etched away using a conventional solvent, leaving behind blocks (, e.g., cylinders, pegs, stripes, donuts or other geometries) of di-block copolymer thin film 26 in the openings of the first photodiode 20*a* (not shown) and the second photodiode 20*b*.

Still referring to FIG. 4, the second photodiode 20*b* is covered with a mask, for example, while the pegs of di-block copolymer thin film in the first photodiode 20*a* are etched using, for example, a solvent or a conventional RIE process. In this way, the blocks of di-block copolymer thin film 26 will be formed in the opening of the second photodiode 20*b*. In an alternative embodiment, the opening of the first photodiode 20*a* can be blocked prior to the deposition of the di-block copolymer over the structure, and then subsequently stripped away with the film.

As should be understood, the pegs of di-block copolymer thin film 26 are structured to control the dosage of the second photodiode 20*b*, e.g., effectively reducing the dosage striking the second photodiode 20*b*. Accordingly using a single dosage, it is possible to provide a full dosage to the first photodiode 20*a*, while providing a reduced dosage to the second photodiode 20*b*. Also, by using the pegs of di-block copolymer thin film 26 it is possible to achieve smaller diffusion distances between the pegs of di-block copolymer thin film 26 (compared to the resist pattern of FIG. 3) to thereby accommodate dopants with smaller diffusion distances, e.g., less than 1000 Å.

Also, much like the optional embodiments of FIG. 3 and FIG. 4, in embodiments with three or more image arrays, it is contemplated to leave some of the blocks 26 in the opening of the first photodiode 20*a* to reduce the dosage striking the first photodiode 20*a*. In embodiments, the patterning over the first photodiode 20*a* and the second photodiode 20*b* will be different based on the desired dosage level required for each photodiode. The photodiode requiring the full dosage, in embodiments, will be exposed through an opening with no blocking resist or pegs.

Figure 5:
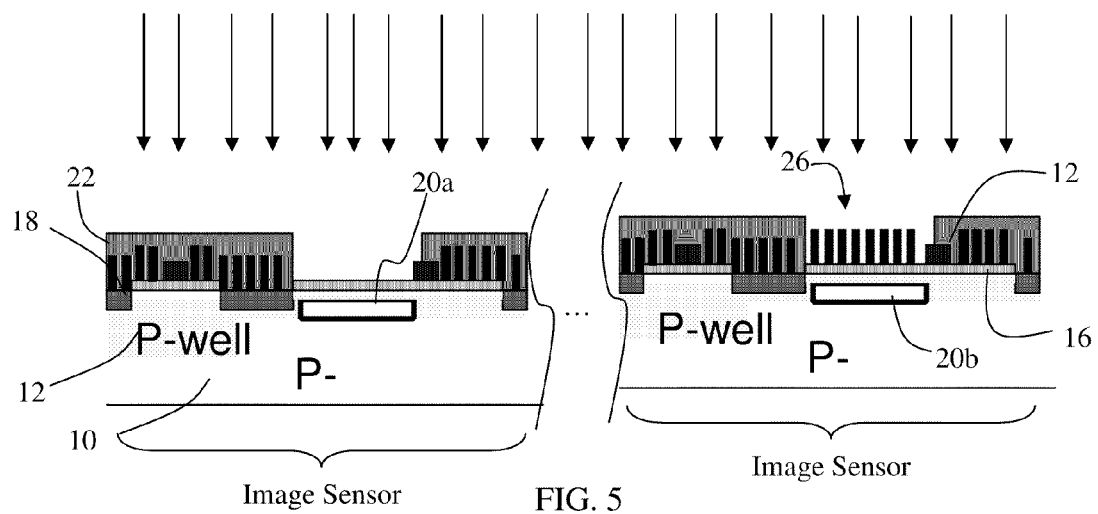
FIG. 5 shows photodiodes with multiple pixel sizes and respective processing steps in accordance with another aspect of the invention.

FIG. 5 shows another embodiment of the present invention. In the embodiment of FIG. 5, blocks of di-block copolymer thin film 26 are formed in the opening over the second photodiode 20*b*, and are configured to provide a smaller diffusion distance than the resist pattern of FIG. 3. As previously discussed, the blocks of di-block copolymer thin film 26 also eliminate the need for light exposure to create (e.g., geometries such as, for example, pegs, cylinders, stripes, donuts, etc., for dosage control, and control the dosage striking the second photodiode 20*b*, thereby effectively reducing the dosage striking the second photodiode 20*b*.

In FIG. 5, the di-block copolymer thin film is deposited on the structure 5, prior to the deposition of the resist 22. In this embodiment, the di-block copolymer thin film is baked to form a strong phase and a weak phase, where the weak phase is etched away to leave behind blocks of di-block copolymer thin film 26 over the structure. The resist 22 is then deposited over the di-block copolymer thin film, and patterned to completely expose the first photodiode 20*a* and the second photodiode 20*b*. More specifically, using a mask with a pattern that matches the resist pattern of FIG. 5, light will pass through the transparent portion in order to completely expose the resist 22 over the first photodiode 20*a* and the second photodiode 20*b*. This, in turn, will completely dissolve the resist 22 over the first photodiode 20*a* and the second photodiode 20*b*.

In FIG. 5, the second photodiode 20*b* is covered with a mask, for example, while the blocks of di-block copolymer thin film over the first photodiode 20*a* are stripped using, for example, a solvent or a conventional RIE process. In this way, the blocks of di-block copolymer thin film 26 will be formed in the opening of the second photodiode 20*b*.

As in the embodiment of FIG. 4, the blocks of di-block copolymer thin film 26 are structured to control the dosage of the second photodiode 20*b*, e.g., effectively reducing the dosage striking the second photodiode 20*b*. Accordingly, it is possible to use a single dosage to provide a full dosage to the first photodiode 20*a* and a reduced dosage 20*b* to the second photodiode 20*b*. Also, much like the optional embodiments of FIGS. 3 and 4 where three or more image arrays are provided, it is also contemplated to leave some of the blocks 26 in the opening of the first photodiode 20*a* to reduce the dosage striking the first photodiode 20*a*.

Figure 6:
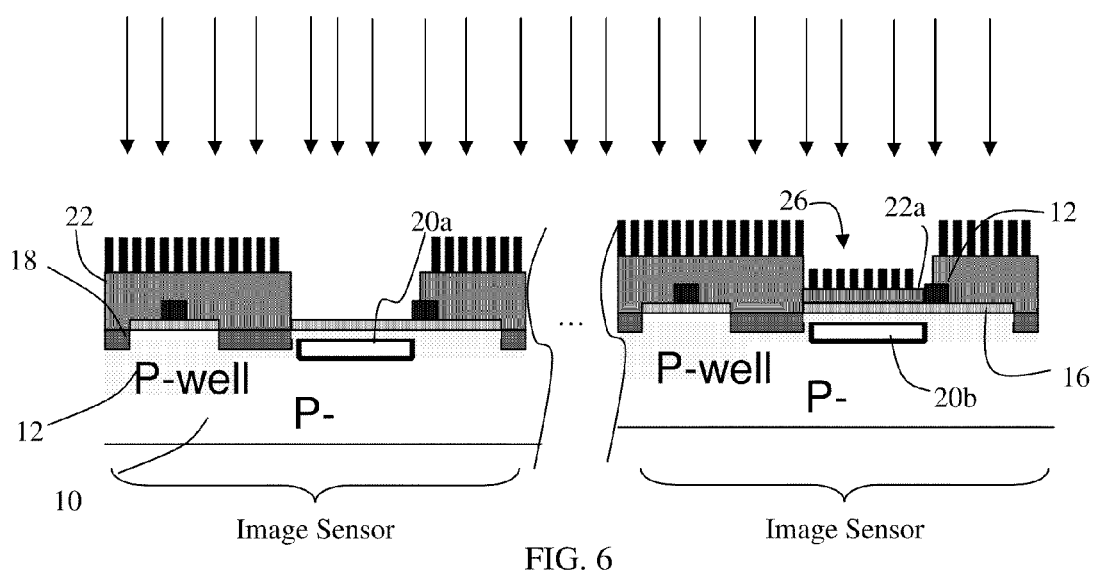
FIG. 6 shows photodiodes with multiple pixel sizes and respective processing steps in accordance with another aspect of the invention.

FIG. 6 shows an additional embodiment, which is a combination of embodiments shown in FIG. 2 and FIG. 4. As seen in this embodiment, the thin resist 22*b* and blocks of di-block copolymer thin film 26 are shown over the second photodiode 20*b*. The use of both the thin resist 22*b* and blocks of di-block copolymer thin film 26 can be used to fine tune the dosage control over the second photodiode 20b. In embodiments, the blocks of di-block copolymer thin film 26 can also be formed in accordance with the embodiment shown in FIG. 5.

Figure 7:
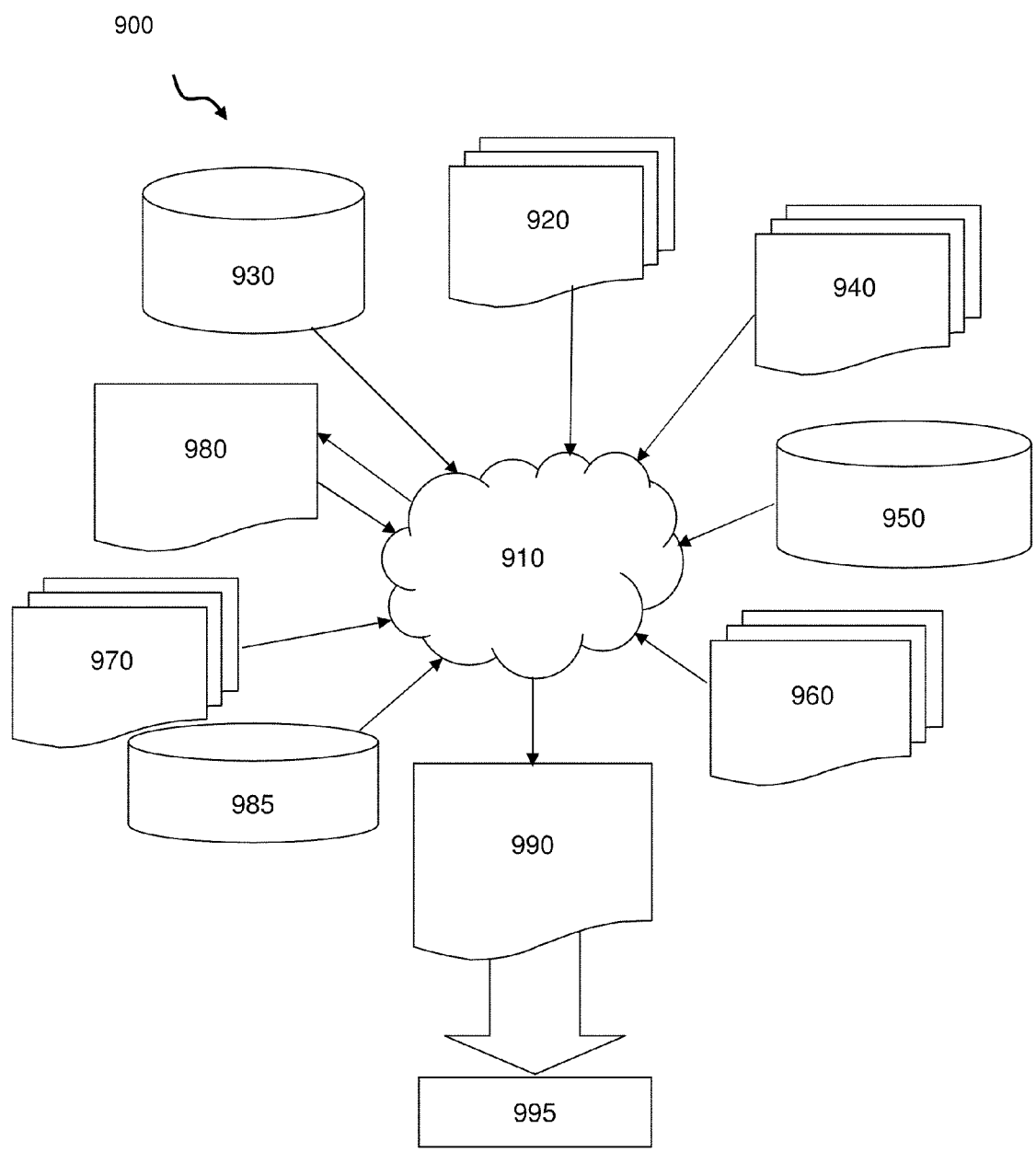
FIG. 7 is a flow diagram of a design process used in semiconductor design, manufacture, and/or test.

FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2-6, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-6, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-6, for example, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-6, for example. In one embodiment, design structure 990 may comprise a compiled, executable HDL simulation model that functionally simulates the devices shown in FIGS. 2-6, for example.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-6, for example. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method comprising:
forming a plurality of imager sensors in a same substrate;
forming a resist over the plurality of imager sensors;
aligning a mask comprising a transparent region and a semi-transparent region over the resist such that the transparent region is aligned with at least one of the plurality of imager sensors that has a smaller pixel size and the semi-transparent region is aligned with at least one of the plurality of image sensors that has a larger pixel size;
exposing the resist through the mask such that at least a first portion of the resist over the at least one of the plurality of imager sensors that has the smaller pixel size is completely dissolved and at least a second portion of the resist over the at least one of the plurality of image sensors that has the larger pixel size is partially dissolved; and
providing a single dosage implant to the plurality of imager sensors, wherein the at least one of the plurality of imager sensors that has the smaller pixel size receives a higher dosage than the at least one of the plurality of imager sensors that has the larger pixel size.

2. The method of claim 1, wherein the forming the plurality of imager sensors includes forming a first photodiode and a second photodiode in the same substrate, wherein the first photodiode is formed with the smaller pixel size and the second photodiode is formed with the larger pixel size.

3. The method of claim 2, wherein the single dose implant provides the higher dosage to the first photodiode than the second photodiode due to a difference in resist thickness.

4. The method of claim 1, wherein:
the resist is formed with a first thickness over the plurality of imager sensors;
the mask is a halftone mask; and
the second portion of the resist over the at least one of the plurality of image sensors that has the larger pixel size is thinned during the exposing such that the second portion of the resist has a second thickness that is less than the first thickness.

5. The method of claim 4, wherein the second thickness of the second portion of the resist only partially blocks the single dosage implant such that the at least one of the plurality of imager sensors that has the larger pixel size receives a lower dosage than the at least one of the plurality of imager sensors that has the smaller pixel size.

6. The method of claim 1, further comprising forming blocks of a di-block copolymer over the at least one of the plurality of image sensors that has the larger pixel size.

7. A method comprising:
forming a plurality of imager sensors in a same substrate;
forming a resist over the plurality of imager sensors;
aligning a mask comprising a transparent region and a patterned region over the resist such that the transparent region is aligned with at least one of the plurality of imager sensors that has a smaller pixel size and the patterned region is aligned with at least one of the plurality of image sensors that has a larger pixel size;
exposing the resist through the mask such that at least a first portion of the resist over the at least one of the plurality of imager sensors that has the smaller pixel size is completely dissolved and at least a second portion of the resist over the at least one of the plurality of image sensors that has the larger pixel size is partially dissolved; and providing a single dosage implant to the plurality of imager sensors, wherein the at least one of the plurality of imager sensors that has the smaller pixel size receives a higher dosage than the at least one of the plurality of imager sensors that has the larger pixel size.

8. The method of claim 7, wherein the forming the plurality of imager sensors includes forming a first photodiode and a second photodiode in the same substrate, wherein the first photodiode is formed with the smaller pixel size and the second photodiode is formed with the larger pixel size.

9. The method of claim 8, wherein the single dose implant provides the higher dosage to the first photodiode than the second photodiode due to a difference in patterning between the first portion of the resist and the second portion of the resist.

10. The method of claim 9, wherein the second portion of the resist is patterned to form geometries.

11. The method of claim 10, wherein the geometries of the second portion of the resist only partially blocks the single dosage implant such that the second photodiode receives a lower dosage than the first photodiode.

12. The method of claim 11, wherein the geometries allow lateral diffusion of the lower dosage into the second photodiode.

13. A method comprising:
   forming a plurality of imager sensors in a same substrate;
   forming a resist over the plurality of imager sensors;
   aligning a mask comprising a first transparent region and a second transparent region over the resist such that the first transparent region is aligned with at least one of the plurality of imager sensors that has a smaller pixel size and the second transparent region is aligned with at least one of the plurality of image sensors that has a larger pixel size;
   exposing the resist through the mask such that at least a first portion of the resist over the at least one of the plurality of imager sensors that has the smaller pixel size is completely dissolved and at least a second portion of the resist over the at least one of the plurality of image sensors that has the larger pixel size is completely dissolved;
   forming blocks of a di-block copolymer over the at least one of the plurality of image sensors that has the larger pixel size; and
   providing a single dosage implant to the plurality of imager sensors, wherein the at least one of the plurality of imager sensors that has the smaller pixel size receives a higher dosage than the at least one of the plurality of imager sensors that has the larger pixel size.

14. The method of claim 13, wherein the forming the plurality of imager sensors includes forming a first photodiode and a second photodiode in the same substrate, wherein the first photodiode is formed with the smaller pixel size and the second photodiode is formed with the larger pixel size.

15. The method of claim 14, wherein the single dose implant provides the higher dosage to the first photodiode than the second photodiode due to the formation of the blocks of the di-block copolymer over the second photodiode.

16. The method of claim 13, wherein the blocks of the di-block copolymer are formed over the at least one of the plurality of image sensors that has the larger pixel size prior to forming the resist.

17. The method of claim 13, wherein the blocks of the di-block copolymer are formed over the at least one of the plurality of image sensors that has the larger pixel size after forming the resist.

18. The method of claim 14, wherein forming the blocks of the di-block copolymer comprises:
   depositing a di-block copolymer thin film on the resist and over the first photodiode and the second photodiode; and
   etching away a weak phase of the di-block copolymer thin film leaving behind the blocks of the di-block copolymer in an opening over the second photodiode.

19. The method of claim 14, wherein forming the blocks of the di-block copolymer over the second photodiode comprises:
   depositing a di-block copolymer thin film over the first photodiode and the second photodiode;
   etching away a weak phase of the di-block copolymer thin film leaving behind a plurality of blocks of the di-block copolymer over the first photodiode and the second photodiode; and
   etching away blocks of the di-block copolymer over the first photodiode.

* * * * *